United States Patent [19]

Mikhael et al.

[11] 3,891,938

[45] June 24, 1975

[54] FUNCTIONALLY TUNABLE ACTIVE LOW-PASS FILTER

[75] Inventors: Wasfy Boushra Mikhael, Ottawa; Lloyd Kenneth Keys, Carp, both of Canada

[73] Assignee: Northern Electric Company Limited, Montreal, Canada

[22] Filed: July 19, 1974

[21] Appl. No.: 490,108

[52] U.S. Cl. .................................. 330/107; 330/31

[51] Int. Cl.² ........................................... H03F 1/36

[58] Field of Search ................ 330/21.31, 107, 109; 326/167

[56] References Cited

UNITED STATES PATENTS 3,787,778 1/1974 Carre'et al. ..................... 330/109 X

OTHER PUBLICATIONS

Kincaid et al., "Get Something Extra in Filter Design", *Electronic Design* 13, June 21, 1969, pp. 114–121.

Welling, "Active Filters: Part 6–The OP Amp Saves Time and Money," *Electronics* Feb. 3, 1969 pp. 82–90.

*Primary Examiner*—James B. Mullins
*Attorney, Agent, or Firm*—John E. Mowle

[57] ABSTRACT

A second-order active low-pass filter in which the elements are arranged to provide a unidirectional sequence of functional tuning by varying only resistors.

2 Claims, 2 Drawing Figures

FUNCTIONALLY TUNABLE ACTIVE LOW-PASS FILTER

This invention relates to an active low-pass filter and more particularly to one which allows a unidirectional sequence of functional tuning of attenuation, resonant frequency and quality factor by varying only resistors.

BACKGROUND OF THE INVENTION

Resistive-capacitive (RC) active low-pass filters provide an economical arrangement for band-limiting signals at audio frequencies. These filters are almost always realized as a cascade of second-order sections for sensitivity and tuning considerations. R.P. Sallen and E.L. Key in an article entitled "A Practical Method of Designing RC-Active Filters" IRE Transactions-Circuit Theory, Vol. CT-2, March 1955, pps 74–85, describe a number of RC-active cut-off filters for use at very low frequencies. In constructing such low-pass filters utilizing either thin or thick film techniques, it is usually necessary to employ laser, an abrasive, or anodization trimming techniques to achieve the final filter parameters. Consequently, it is advantageous to be able to use a unidirectional tuning sequence by trimming only resistors. For, if the trimming elements are interdependent, it will be necessary to approach the final values in a series of ever-decreasing steps in order not to overtrim.

SUMMARY OF THE INVENTION

The present invention overcomes this problem by providing an RC-active low-pass filter in which the pole resonant frequency $\omega_p$, the pole quality factor $Q_p$ and the d-c attenuation factor H can be tuned in a unidirectional sequence by trimming only resistors. Thus, in accordance with the present invention there is provided a functionally tunable active low-pass filter comprising a non-inverting essentially unity gain amplifier. First and second resistors are serially connected between the input of the filter and the input of the amplifier. A first capacitor is connected between the input of the amplifier and ground. A second capacitor and a third resistor are connected in shunt between the output of the amplifier and the junction of the first and second resistors. The circuit arrangement is such that only the pole quality factor $Q_p$ is a function of the third resistor, while only the pole resonant frequency $\omega_p$ and the pole quality factor $Q_p$ are a function of the second resistor connected to the input of the amplifier. Thus by trimming the second and then the third resistors unidirectional functional tuning of the filter is achieved.

In order to vary the pass-band attenuation through the filter, a particular embodiment includes a fourth resistor connected between the junction of the first and second resistors and ground. Changing the value of this resistor affects the d-c attenuation factor H, the pole resonant frequency $\omega_p$ and the pole quality factor $Q_p$. Hence, by trimming the fourth, second and third resistors in that order, a complete unidirectional sequence of functional tuning for an active RC low-pass filter can be readily achieved. Such a filter has relatively low sensitivity to passive element values and consequently is relatively immune to temperature and power supply variations.

BRIEF DESCRIPTION OF THE DRAWINGS

An example embodiment of the invention will now be described with reference to the accompanying drawings in which.

DESCRIPTION OF THE PREFERRED EMBODIMENT

Figure 1:
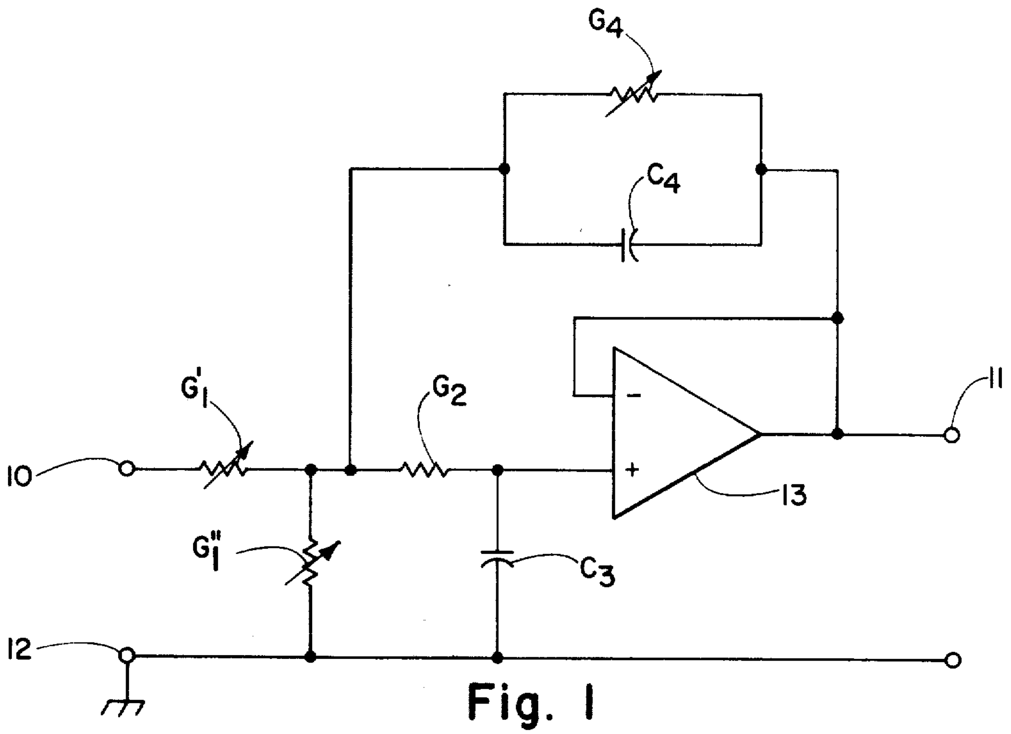
FIG. 1 is a schematic circuit diagram of a functionally tunable active low-pass filter.

In the embodiment illustrated in the accompanying drawing, the passive components will be designated by reference characters, the relative values of which will be such as to satisfy the equations found in the following technical description.

Referring to FIG. 1, the functionally tunable active low-pass filter comprises an input terminal 10, an output terminal 11 and a common or ground terminal 12. A non-inverting substantially unity gain amplifier 13 has its output connected to the output terminal 11. This amplifier 13 is readily realized utilizing an operational amplifier having a high input impedance and low output impedance and by connecting its inverting input terminal to its output, as illustrated in the schematic diagram.

Connected between the input terminal 10 and the non-inverting input of the amplifier 13 are two serially connected resistors $G'_1$ and $G_2$. Connected between the junction of the two resistors and the common terminal or ground 12 is a resistor $G''_1$. A capacitor $C_3$ is connected between the non-inverting input of the amplifier 13 and ground. In addition, the parallel combination of a resistor $G_4$ and a capacitor $C_4$ are connected between the output of the operational amplifier 13 and the junction of the two resistors $G'_1$ and $G_2$. As will become apparent later, the resistor $G''_1$ is optional and is utilized to control the attenuation through the filter.

For an ideal operational amplifier 13, the voltage transfer ratio T(s) of this filter is as follows:

$$T(=\ ) = H \cdot \frac{G_1 G_2/C_3 C_4}{s^2 + s(G_1 + G_2 + G_4)/C_4 + G_1 G_2/C_3 C_4} \qquad (1)$$

where:

$s$ = complex frequency variable $G_1, G_2, G_4$ = conductance of resistors $C_3, C_4$ = capacitance of capacitors $G_1 = G'_1 + G''_1$ and $H = G'_1/G_1$ ($H \leq 1$)

From equation (1), the pole natural resonant freqeuncy $\omega_p$ and the pole quality factor $Q_p$ are equal to:

$$\omega_p = (G_1 G_2/C_3 C_4)^{1/2} \qquad (2)$$

$$Q_p = \left(\frac{G_1}{G_2} \cdot \frac{C_4}{C_3}\right)^{1/2} \Big/ \ 1 + \left(\frac{G_4}{G_2} + \frac{G_1}{G_2}\right) \qquad (3)$$

The following is a suggested method of choosing suitable element values. In equation (1) let $$C_3 = C,\ G_1 = G_2 = G = 1/R,\ G'_1 = HG\ G''_1 = G - G'_1,\ G_4 = \alpha G\ (\alpha \quad 0) \qquad (4)$$

Using equations (2) (3) and (4) the following is derived:

$$Q_p^2 = \frac{C^4}{C^3} \Big/ (2+\alpha)^2 \text{ and } C^3 = C = 1/[\omega_p\, Q_p\, R(2+\omega)] \quad (5)$$

From equation (5), $C_4$ is obtained as $$C_4 = Q_p(2+\alpha)/\omega_p R = 1/(\omega_p^2 R^2 C) \quad (6)$$

From equations (4), (5) and (6), as $\alpha$ becomes smaller, $C_3$ gets larger, while $G_4$ and $C_4$ get smaller.

Unidirectional functional tuning of the filter circuit is accomplished as follows:

First, the resistor $G''_1$ is trimmed until the d-c attenuation factor is equal to $H$. (For $H = 1$, $G''_1 = 0$ and this step is not required);

Second, an input signal is applied at a frequency $\omega = \omega_p$, and the circuit resonant frequency is adjusted by trimming resistor $G_2$ until a 90° phase shift between the input terminal 10 and the output terminal 11 is obtained; and Third, the pole quality factor is adjusted by trimming resistor $G_4$ until the attenuation at $\omega_p$ becomes equal to $HQ_p$.

For a single pole, frequency compensated operational amplifier 13, the open-loop gain A is given by $$A = \frac{A_o\,\omega_c}{s+\omega_c} \quad (7)$$

where $A_o$ and $\omega_c$ are the d-c gain and cut-off frequency respectively.

Hence, the closed loop gain of the essentially unity gain amplifier is given by:

$$A_c = \frac{1}{\dfrac{s}{A_o\omega_c} + \left(1 + \dfrac{1}{A_o}\right)} \quad (8)$$

Using the design values given by equations (4), (6) and considering the amplifier gain to be finite, the transfer function of the proposed circuit becomes $$T(s) = \frac{\omega_p^2 A_c}{s^2 + s\dfrac{\omega_p}{Q_p}\left[1 + Q_p^2(2+\alpha)(1-A_c)\right] + \omega_p^2\left[1+\alpha(1-A_c)\right]} \quad (9)$$

For $\omega_p << A_o\omega_C$, which is a reasonable assumption in active filter applications, it can be shown that:

$$\omega_{pa} \approx \omega_p \quad (10)$$

and $$Q_{pa} \cong \frac{Q_p}{1 + \dfrac{Q_p^2(2+\alpha)}{A_o}} \quad (11)$$

where $\omega_{pa}$ and $Q_{pa}$ denote the actually realized pole resonant frequency and pole quality factor respectively.

Frequently, low-pass transfer function specifications require a multiplier constant different from unity. If the multiplier constant is less than or equal to unity, the circuit described above can be used. For a multiplier constant greater than unity, an additional amplifier is normally required. If this gain requirement can be incorporated in the filter, no additional amplifier would be required. The low-pass filter circuits of Sallen and Key can be designed with a d-c gain greater than unity. By cascading the Sallen and Key circuits with those of the present invention, the advantages of both gain and low sensitivity to element values is obtained.

Figure 2:
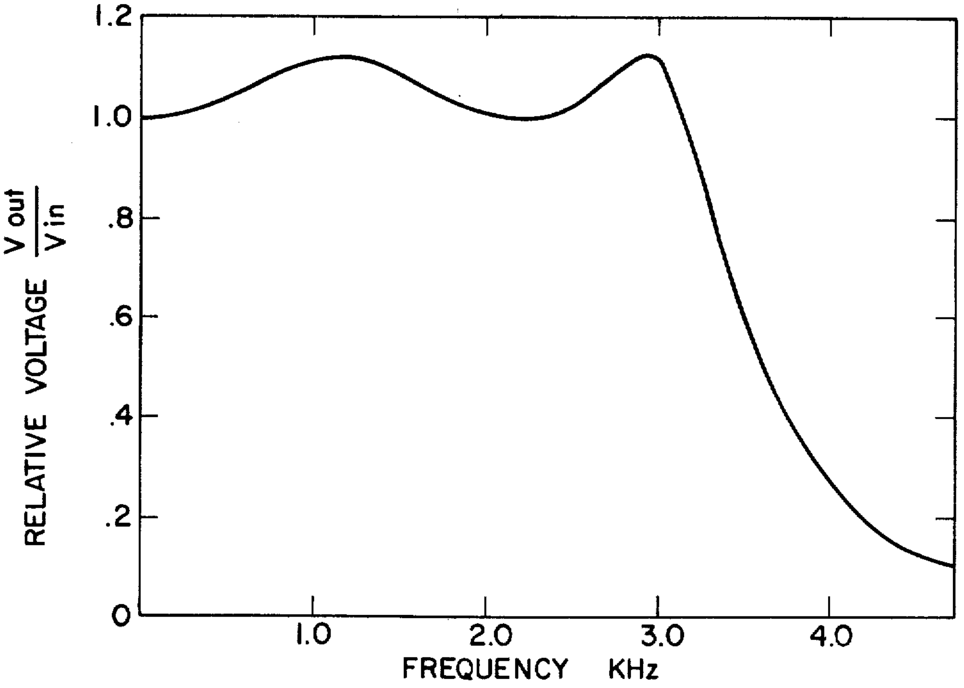
FIG. 2 illustrates the frequency response of a typical two-section filter of the type illustrated in FIG. 1.

FIG. 2 illustrates a typical response characteristic which is obtained by cascading two sections of the low-pass filter illustrated in FIG. 1. Typical non-limiting resistive values of the conductive circuit components which are used to obtain this response are as follows:

| | |
|---|---|
| First Section | |
| $G'_1 \cong$ 40kΩ (variable) | $G''_1 = \infty\Omega$ |
| $G_2 \cong$ 40KΩ | $C_3$ = 1.0nF |
| $G_4 \cong$ 40KΩ (variable) | $C_4$ = 4.6nF |
| Second Section | |
| $G'_1 \cong$ 40KΩ (variable) | $G''_1 = \infty\Omega$ |
| $G_2 \cong$ 40KΩ | $C_3$ = 0.12nF |
| $G_4 \cong$ 40KΩ (variable) | $C_4$ = 13.4nF |

What is claimed is:

1. A functionally tunable active low-pass filter comprising:

input, output and common terminals;

a non-inverting essentially unity gain amplifier having its output connected to said output terminal;

first and second resistors serially connected between said input terminal and the input of said amplifier;

a first capacitor connected between the input of said amplifier and said common terminal;

a second capacitor and a third resistor connected in shunt between the output of said amplifier and the junction of said first and second resistors;

the amplifier, resistors and capacitors coacting such that variations in resistance of the second resistor connected to the input of the amplifier affects only the pole resonant frequency $\omega_p$ and the pole quality factor $Q_p$, and variations in resistance of the third resistor affects only the pole quality factor $Q_p$, thereby enabling a unidirectional sequence of functional tuning of said filter.

2. A functionally tunable active low-pass filter as defined in claim 1 which additionally comprises:

a fourth resistor connected between the junction of said first and second resistors and the common terminal;

the amplifier, resistors and capacitors coacting such that variations in resistance of said fourth resistor affects the d-c attenuation factor H, the pole resonant frequency $\omega_p$ and the pole quality factor $Q_p$.

* * * * *